United States Patent
Berke

(10) Patent No.: US 8,745,323 B2
(45) Date of Patent: Jun. 3, 2014

(54) SYSTEM AND METHOD FOR CONTROLLER INDEPENDENT FAULTY MEMORY REPLACEMENT

(75) Inventor: Stuart Allen Berke, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 244 days.

(21) Appl. No.: 13/223,980

(22) Filed: Sep. 1, 2011

(65) Prior Publication Data

US 2013/0060996 A1     Mar. 7, 2013

(51) Int. Cl.
G06F 12/16    (2006.01)
G06F 11/16    (2006.01)
G06F 12/02    (2006.01)
G06F 3/06     (2006.01)

(52) U.S. Cl.
CPC ........ *G06F 11/1666* (2013.01); *G06F 12/0292* (2013.01); *G06F 3/0683* (2013.01)
USPC ............ 711/105; 711/170; 711/202; 714/6.1; 714/6.3

(58) Field of Classification Search
CPC   G06F 11/1666; G06F 12/0292; G06F 3/0683
USPC ...................... 711/105, 170, 202; 714/6.1, 6.3
See application file for complete search history.

(56) References Cited

U.S. PATENT DOCUMENTS

| | | | |
|---|---|---|---|
| 6,192,486 B1 | 2/2001 | Correale et al. | |
| 6,223,301 B1 * | 4/2001 | Santeler et al. | ............... 714/6.2 |
| 6,467,048 B1 | 10/2002 | Olarig et al. | |
| 7,620,860 B2 | 11/2009 | Wang et al. | |
| 7,694,195 B2 | 4/2010 | Khatri et al. | |
| 7,783,919 B2 | 8/2010 | Khatri et al. | |
| 7,949,913 B2 | 5/2011 | Norrod et al. | |
| 8,276,029 B2 | 9/2012 | Khatri et al. | |
| 2007/0058471 A1 * | 3/2007 | Rajan et al. | ................... 365/222 |
| 2008/0282045 A1 * | 11/2008 | Biswas et al. | ................. 711/159 |
| 2009/0049257 A1 | 2/2009 | Khatri et al. | |
| 2010/0017650 A1 * | 1/2010 | Chin et al. | ........................ 714/6 |
| 2010/0070690 A1 * | 3/2010 | Amer et al. | .................... 711/103 |
| 2011/0309475 A1 * | 12/2011 | Lee | ............................... 257/532 |
| 2013/0227342 A1 | 8/2013 | Shepherd | |

* cited by examiner

*Primary Examiner* — Than Nguyen
(74) *Attorney, Agent, or Firm* — Baker Botts L.L.P.

(57) ABSTRACT

In accordance with the present disclosure, a system and method for controller independent faulty memory replacement is described. The system includes a system memory component with a system memory component architecture. The system also includes a memory buffer coupled to the system memory component. The memory buffer may include at least one spare memory location corresponding to a faulty memory location of the system memory component. Additionally, the system memory component architecture may receive a read command directed to an address of the system memory component containing the faulty memory location and output, in response to the read command, data corresponding to the address from both the system memory component and the at least one spare memory component.

19 Claims, 7 Drawing Sheets

300

| Row Address (16:0) | Column Address (11:0) | Bank (2:0) | Rank (15:0) | Data Bit End (71:0) | Data Bit Start (71:0) | Data Cycles (7:0) | Memory Needed | Valid | Armed | Note |
|---|---|---|---|---|---|---|---|---|---|---|
| 00000000000001000 | 000000000100 | 111 | 3 | 7 | 4 | 11111111 | 2 Bytes | Y | N | Buffer is actively replacing nibble 7:4 for Row = 1000, Column = 100, Bank = 7, Rank = 3 |
| 00000000000010001 | 000000000010 | 101 | 6 | 71 | 0 | 11111111 | 36 Bytes | Y | N | Buffer is actively replacing all DIMM bits for Row = 10001, Column = 10, Bank = 5, Rank = 6 |
| 00000000010101010 | 000001110011 | 010 | 14 | 5 | 5 | 00001000 | 1 Bit | N | Y | Buffer is armed to replace (on next access to) single bit 5, on the 4th data cycle for row = 10101010, Column = 110011, Bank = 2, Rank = 14 |
| XXXXXXXXXXXXX | XXXXXXXXXXX | XXX | XX | X | X | XXXXXXX | N/A | N | N | Unused table entry |
| XXXXXXXXXXXXX | XXXXXXXXXXX | XXX | XX | X | X | XXXXXXX | N/A | N | N | Unused table entry |
| XXXXXXXXXXXXX | XXXXXXXXXXX | XXX | XX | X | X | XXXXXXX | N/A | N | N | Unused table entry |

| Row Address (16:0) | Column Address (11:0) | Bank (2:0) | Rank (15:0) | Data Bit End (71:0) | Data Bit Start (71:0) | Data Cycles (7:0) | Memory Needed | Valid | Armed | Note |
|---|---|---|---|---|---|---|---|---|---|---|
| 00000000000001000 | 000000000100 | 111 | 3 | 7 | 4 | 11111111 | 2 Bytes | Y | N | Buffer is actively replacing nibble 7:4 for Row = 1000, Column = 100, Bank = 7, Rank = 3 |
| 00000000000010001 | 000000000010 | 101 | 5 | 71 | 0 | 11111111 | 36 Bytes | Y | N | Buffer is actively replacing all DIMM bits for Row = 10001, Column = 10, Bank = 5, Rank = 6 |
| 00000000101101010 | 000000110011 | 010 | 14 | 5 | 5 | 00001000 | 1 Bit | N | Y | Buffer is armed to replace (on next access to) single bit 5, on the 4th data cycle for row = 1010101010, Column = 110011, Bank = 2, Rank = 14 |
| XXXXXXXXXXXXXXXXX | XXXXXXXXXXXX | XXX | XX | X | X | XXXXXXXX | N/A | N | N | Unused table entry |
| XXXXXXXXXXXXXXXXX | XXXXXXXXXXXX | XXX | XX | X | X | XXXXXXXX | N/A | N | N | Unused table entry |
| XXXXXXXXXXXXXXXXX | XXXXXXXXXXXX | XXX | XX | X | X | XXXXXXXX | N/A | N | N | Unused table entry |

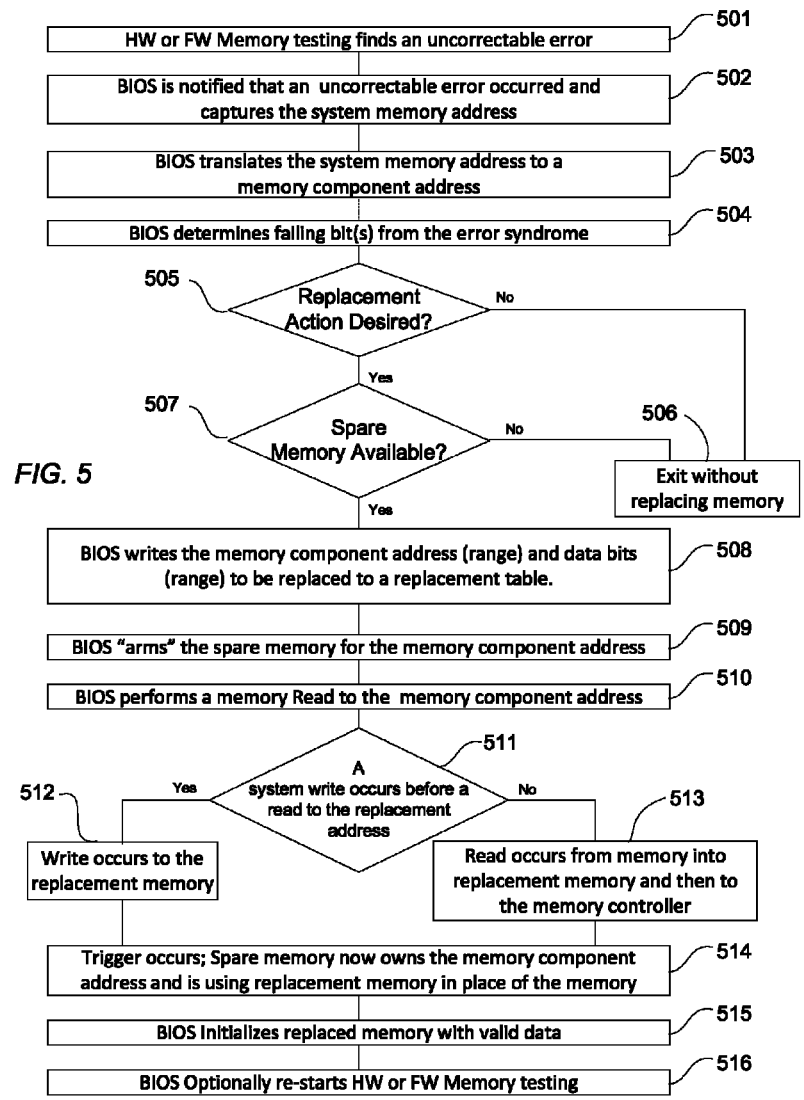

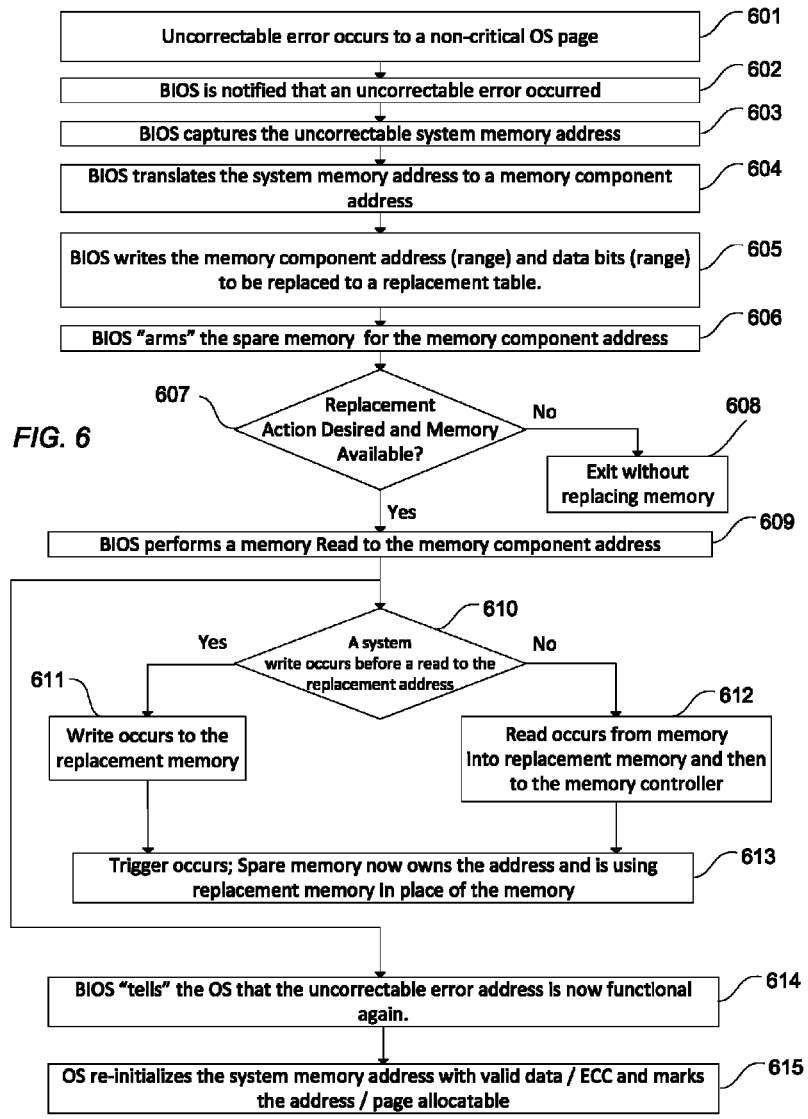

SYSTEM AND METHOD FOR CONTROLLER INDEPENDENT FAULTY MEMORY REPLACEMENT

TECHNICAL FIELD

The present disclosure relates generally to the operation of computer systems and information handling systems, and, more particularly, to a system and method for controller independent faulty memory replacement.

BACKGROUND

As the value and use of information continues to increase, individuals and businesses seek additional ways to process and store information. One option available to these users is an information handling system. An information handling system generally processes, compiles, stores, and/or communicates information or data for business, personal, or other purposes thereby allowing users to take advantage of the value of the information. Because technology and information handling needs and requirements vary between different users or applications, information handling systems may vary with respect to the type of information handled; the methods for handling the information; the methods for processing, storing or communicating the information; the amount of information processed, stored, or communicated; and the speed and efficiency with which the information is processed, stored, or communicated. The variations in information handling systems allow for information handling systems to be general or configured for a specific user or specific use such as financial transaction processing, airline reservations, enterprise data storage, or global communications. In addition, information handling systems may include or comprise a variety of hardware and software components that may be configured to process, store, and communicate information and may include one or more computer systems, data storage systems, and networking systems.

An information handling system may include multiple storage media, including system memory. Memory may include hard drives, random-access memory (RAM), static RAM, dynamic RAM (DRAM), double data rate RAM (DDR RAM), etc. One problem with information handling systems is the availability of memory. In particular, memory may include from manufacturing, or develop over time, faults in memory locations. The faults may degrade the performance of the computer by decreasing data capacity or, in certain instances, corrupting data. Additionally, correcting for faulty memory locations is generally problematic because it requires special processing by either a system processor or a memory controller, which diverts processing time and decreases the overall speed of the information handling system.

SUMMARY

In accordance with the present disclosure, a system and method for controller independent faulty memory replacement is described. The system includes a system memory component with a system memory component architecture. The system also includes a memory buffer coupled to the system memory component. The memory buffer may include at least one spare memory location corresponding to a faulty memory location of the system memory component. Additionally, the system memory component architecture may receive a read command directed to an address of the system memory component containing the faulty memory location and output, in response to the read command, data corresponding to the address from both the system memory component and the at least one spare memory component.

The system and method disclosed herein is technically advantageous because it replaces faulty memory in a manner which is invisible to, and independent of any capabilities or support for memory remapping, memory sparing, or memory mirroring within host memory controllers or processors. Specifically, the memory controller or processor may issue commands to a memory address without any knowledge that any portion of the data at the memory address has been replaced by spare memory components or spare storage elements. The replaced spare memory may support all standard features and functions of the system memory, including operating frequency, access time, power management modes, RAS modes, and requires no special controller support for initialization, training, self-test, or diagnostics. The replaced spare memory operates independent of the host controller's error correction algorithm implementation, data coding, data scrambling, data encryption, nibble or byte or lane swapping, cache line size, and any other data coding schemes. The controller independent memory replacement eliminates any performance overhead for error correction that would have occurred if the fault remained in memory, eliminates loss of system and user visible physical memory capacity due to faulty memory (which would otherwise need to be mapped out), and without taking additional processing cycles to determine the replacement address (for controllers or processors that include memory remapping/replacement support). Additionally, the system and method may be implemented in buffer memory incorporated within certain system memory components, decreasing the expense of implementation. Other technical advantages will be apparent to those of ordinary skill in the art in view of the following specification, claims, and drawings.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 3 illustrates an example faulty memory table for storing faulty memory information according to aspects of the present disclosure.

FIG. 5 is an example method for controller independent faulty memory replacement, according to aspects of the present disclosure.

FIG. 6 is an example method for controller independent faulty memory replacement, according to aspects of the present disclosure.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communication with external devices as well as various input and output (I/O) devices, such as a keyboard, a mouse, and a video display. The information handling system may also include one or more buses operable to transmit communications between the various hardware components.

Figure 1:
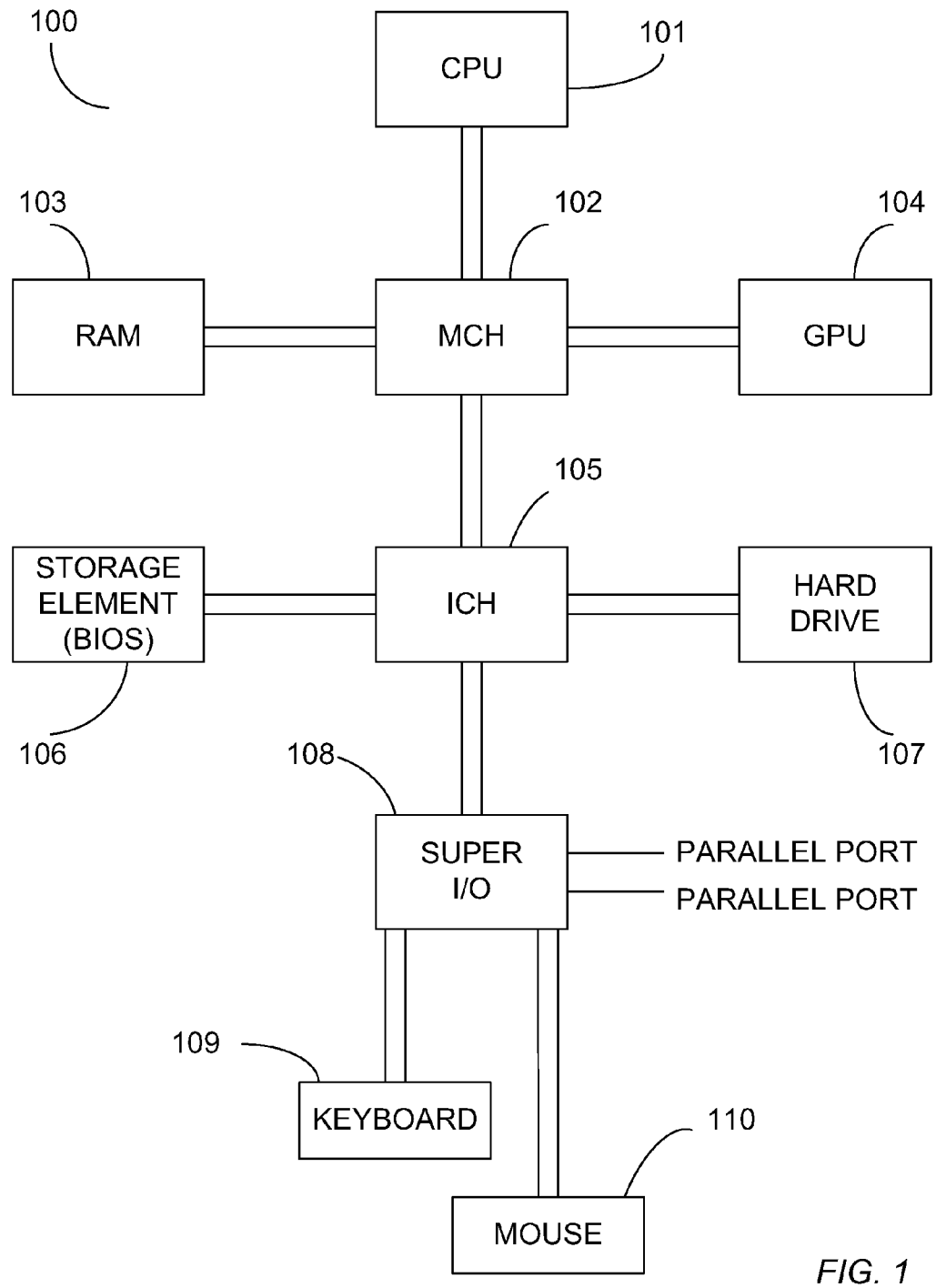
FIG. 1 is an example information handling system.

Shown in FIG. 1 is a block diagram of a typical information handling system 100. A processor or CPU 101 of the typical information handling system 100 is communicatively coupled to a memory controller hub or north bridge 102. Memory controller hub 102 may include a memory controller for directing information to or from various system memory components within the information handling system, such as RAM 103, storage element 106, and hard drive 107. The memory controller hub may be coupled to RAM 103 and a graphics processing unit 104. Memory controller hub 102 may also be coupled to an I/O controller hub or south bridge 105. I/O hub 105 is coupled to storage elements of the computer system, including a storage element 106, which may comprise a flash ROM that includes the BIOS of the computer system. I/O hub 105 is also coupled to the hard drive 107 of the computer system. I/O hub 105 may also be coupled to a Super I/O chip 108, which is itself coupled to several of the I/O ports of the computer system, including keyboard 109, mouse 110, and one or more parallel ports. The above description of an information handling system should not be seen to limit the applicability of the system and method described below, but is merely offered as an example computing system.

Errors may occur in each of the system memory components, such as system memory component 103. Faulty memory locations may be uncorrectable if the memory controller does not support an error correction code or if the faults exceed the ability of the code to correct the data. Faulty memory locations may also be left as is and corrected by the memory controller if an error correction code is available and able to correct the data. Additionally, faulty memory locations may be removed from available memory entirely, decreasing the overall data capacity of the system, or alternate locations may be identified and utilized using either the CPU 101 or the memory controller from memory controller hub 102. For example faulty memory locations may be kept in a faulty memory table along with replacement memory locations. When a read/write operation is triggered, the CPU 101 or memory controller 102 may access the faulty memory table, identify the replacement address, and specifically write to the replacement address. Such an operation may require additional cycles to access memory, decreasing processing capacity.

Figure 2A:
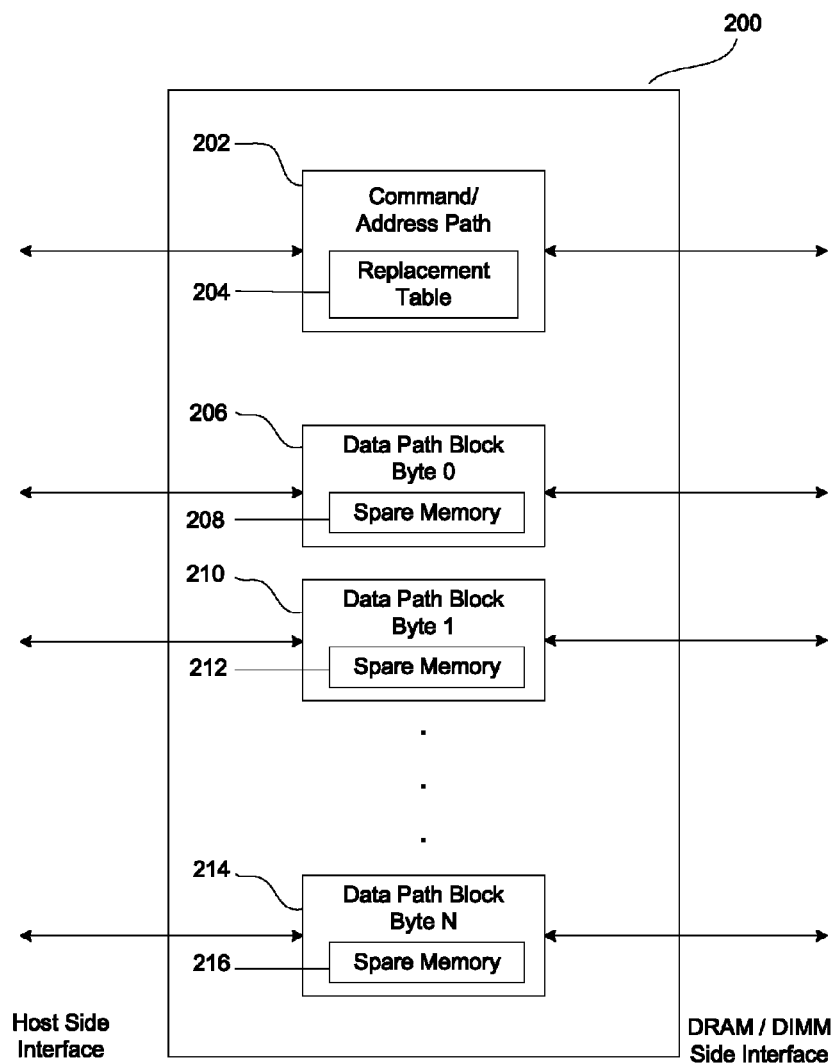
FIG. 2a is example architecture incorporating aspects of the present disclosure.

FIG. 2a illustrates example architecture 200 through which controller independent faulty memory replacement may be implemented, according to aspects of the present disclosure. In certain embodiments, the architecture of FIG. 2a may be implemented as software, hardware, or firmware within a memory subsystem. For example, the architecture may be implemented in a memory buffer device located on a DIMM, motherboard, or riser board. In certain embodiments, the memory buffer device may be located within a 3-dimensional stacked DRAM package or a DDR DRAM system memory component. The architecture may be implemented as a single device or distributed across multiple devices. Notably, as will be described below, the architecture may be connected between a memory controller and a system memory component via a memory channel. In each alternative embodiment, the architecture may process read/write commands directly from the memory controller or CPU, without requiring the memory controller or CPU to have any knowledge or awareness of the faulty memory replacement architecture.

As can be seen in FIG. 2a, architecture 200 may be connected between a host side interface and a DRAM/DIMM side interface. The host side interface may communicate via a data channel with a memory controller. A memory controller may output commands to memory, such as DRAM/DIMM, through the Command/Address Path 202. The commands may include a read or write command and a memory address within the DRAM/DIMM. The command/address path 202 within architecture 200 may include a replacement table 204, such as the replacement table 300 in FIG. 3, discussed below, located in a memory buffer device. In certain embodiments, the memory buffer device may comprise multiple buffers coupled to multiple system memory components, such as DIMMs. The replacement table 204 may identify bitwise replacement locations within the memory buffer device, such that a faulty bit or faulty bits within, for example, DRAM/DIMM may be replaced with a spare bit or spare bits in the memory buffer device coupled to the DRAM/DIMM.

In addition to a read/write command and address, a memory controller may output or receive data from the memory, such as DRAM/DIMM. The data may be communicated between the memory controller and the system memory component over data paths, represented by data path blocks 206, 210, and 214. The data paths may be, for example, double data rate (DDR) channels, each transmitting a byte of information. The data paths may be combined to transmit larger units of data, such as words. Each data path may access spare memory locations, represented by elements 208, 212, and 216. The spare memory locations may be located in a single memory buffer device coupled to the system memory component, or in multiple buffer devices coupled to the system memory component.

In order to support certain power management modes such as Self Refresh, System S3 (Standby), or Clock Stopped Power Down Mode, elements of the architecture 200 may be designed to operate from an Auxiliary power supply rail commonly referred to as Vaux. This allows the contents of the Spare Memory and Replacement Table elements to maintain valid data and state through system or main memory power management state changes.

Figure 2B:
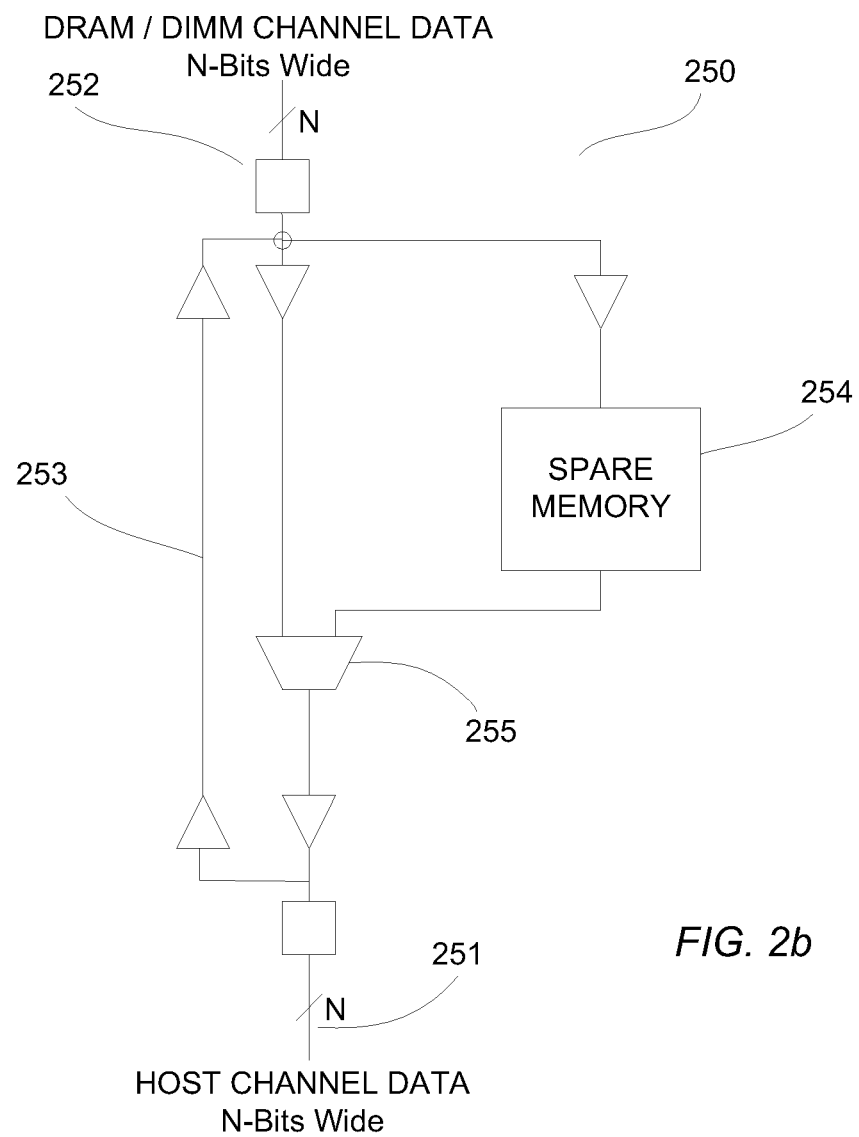
FIG. 2b is example architecture incorporating aspects of the present disclosure.

FIG. 2b, illustrate an example architecture of a data path. The architecture 250 may represent a single data path block, such as data path block 206, or may represent a combination of multiple data path blocks. The architecture 250 may be connected to a memory data channel 251, via a memory controller hub such as the memory controller hub 102 described above. The memory channel 251 may carry host channel data from a memory controller or a CPU. The host channel data may be N-bits wide, such as one-bit, four-bits, sixteen-bits, etc.

A write data command and address from a computer system may be received in a memory architecture, such as architecture 200 at block 202. The architecture 200 at block 202 may compare the address against a replacement table 204. The replacement table may identify a faulty bit or faulty bits within the target address as well as a replacement bit or replacement bits, corresponding to the faulty bit or faulty bits, located in spare memory location. In certain embodiments, the spare memory location may be, for example, in a memory buffer device located within a dual-inline memory module (DIMM), such as a buffer in a load-reduced DIMM or a proprietary Buffer on Board or Buffer on Riser. In certain other embodiments, the spare memory locations may also be in a 3DS/through-silicon via (TSV) buffer incorporated within a DRAM package. In addition, the spare memory locations may also be located within the system memory component in a static RAM (SRAM), within an external memory device such as DRAM or SRAM, or within any other suitable storage technology with access time less than or equal to the primary storage media in the system memory component. Upon receipt of the write command, the architecture may cause portions of the write data corresponding to non-faulty bits of the target address to be written to the target address and portions of the write data corresponding to faulty bits of the target address to be written to spare memory locations corresponding to the faulty bits of the target address.

A read command from a memory controller or CPU may also be received in the architecture 200 at block 202. The architecture 200 at block 202 may compare the target address with a list of address entries stored within a replacement table, as will be discussed below. If the target address within the read command is identified as including faulty bits, the architecture 200 at block 202 may then cause portions of the target data from both the system memory component and the spare memory locations. In certain embodiments, the read data may be received on a bit-by-bit basis from the system memory component and spare memory location. For example, if bits 0 and 1 of a target address in the system memory component are faulty, the architecture may retrieve all or part of the data in the target address from the system memory component as well as the data in spare memory locations corresponding to bits 0 and 1 of the target address. The architecture 200 at block 202 may then output a command to the multiplexor 255 on a per cycle basis, such that data from the spare memory locations corresponding to bits 0 and 1 of the target address is multiplexed with bits 2-7 from the target address, such that the entire byte of data corresponding to the target address is output, without extra processing cycles by either a memory controller or a CPU. Rather, the memory controller or CPU outputs a single command and target address and the target data is written to or retrieved from the system memory component in a manner transparent to the memory controller or CPU. In certain embodiments, memory can be replaced on a per cycle basis, or an entire burst of four or eight cycles depending on the implementation. Additionally, as will be appreciated by one of ordinary skill in view of this disclosure, the architecture does not require holes in the address space—the full customer memory is still usable and reported.

FIG. 3 illustrates an example replacement table 300, which may be located within memory architecture, such as architecture 200 at block 202 from FIG. 2a. The example table 300 may be arbitrarily deep, limited only by implementation requirements and constraints. Each entry of memory to be replaced may, for example, be identified by row address, column address, bank, rank, data bit, data cycle, or any other identifier. In certain embodiments, the memory to be replaced may be a single DRAM access, or an entire range of accesses. The table 300 may also include a column for identifying the amount of memory needed to replace the fault memory as well as a spare memory location in a memory buffer that will correspond to the faulty memory.

In certain embodiments, the table 300 may include a valid bit. The valid bit may identify if the associated entry in the table is enabled and contains valid replacement data. Additionally, the table 300 may include an armed status bit. The armed status bit may be used to trigger replacement on the next address match of a target address to a faulty memory location identified in the table. For example, on the next address match, a host write data or read data operation may be clocked into the memory buffer and the valid bit may be switched to indicate the entry is up to date. Likewise, the armed status bit may flip to no. All subsequent host reads and writes to the matched address may then be directed to spare memory locations corresponding to the faulty locations of the target address in the system memory component to ensure coherence. In certain embodiments, writes to the system memory component may be dropped or allowed to occur. Likewise, reads from the system memory may be ignored.

Figure 4:
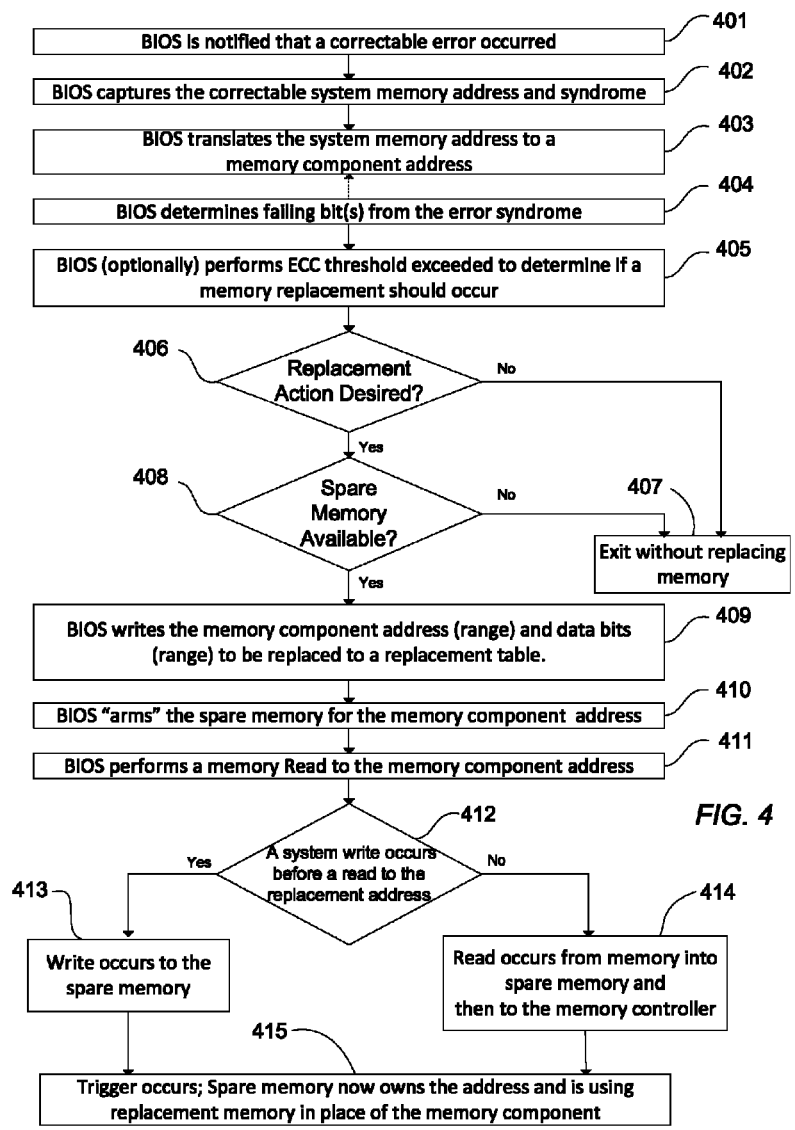
FIG. 4 is an example method for controller independent faulty memory replacement, according to aspects of the present disclosure.

FIG. 4 illustrates an example method incorporating aspects of the present disclosure. In particular, FIG. 4 describes a method for a controller independent memory replacement of a correctable memory error. A correctable memory error may be, in some instances, an error in a portion of a memory address range that may not require the entire address range be removed. For example, the memory error may be correctible if the number of errors in the address range is within the capabilities of the system memory error correction code.

At step 401, the basic input/output system (BIOS) may be notified that a correctable error has occurred. At step 402, the BIOS may capture the correctable system memory address and syndrome. The syndrome may include a cause of the correctable error, such as a bit error. At step 403, the BIOS may translate the system memory address to a system memory component address. The system memory component address may be specific to the architecture of the system memory component instead of a system memory address which reflects the system wide addressing generated by the BIOS/OS. For example, where the system memory component is DDR DRAM with DIMMs, the BIOS may translate the system memory address to a system memory component address including a specific rank, RAS, CAS, bank, etc.

At step 404, the BIOS may determine the failing bits in the memory address range from an error syndrome code. At step 405, the BIOS may optionally perform a test to determine if the number of corrections performed at that memory address exceeds an ECC threshold. The system may include a pre-determined threshold or rate above which memory replacement should occur, such as one hundred corrections within an hour as an example. At step 406, it is determined whether a replacement action is desired. For example, if the number of prior corrections is not above the ECC threshold, a faulty memory replacement may not be desirable, and the method may progress to step 407, where the process exits without replacing memory. In contrast, if the number of prior corrections is above the ECC threshold, a faulty memory replacement may be desirable, and the method may progress to step 408.

At step 408, it is determined whether a spare memory location is available. As described above, a spare memory location may be within a memory buffer disposed within or coupled to the system memory component, such as a buffer in a load-reduced DIMM or a proprietary Buffer on Board or Buffer on Riser. In certain other embodiments, the spare memory location may also be within a 3DS/through-silicon via (TSV) buffer incorporated within a DRAM package. Step 408 may include determining whether there are available spare memory locations within a memory buffer coupled to the system memory component. If there are not spare memory location available, the process may exit without replacing the memory at step 407. If there spare memory locations are available, the process may proceed to step 409.

At step 409, the BIOS may write the system memory component address and data bits to be replaced into a replacement table accessible by the architecture of the memory component, such as the architecture 200 in FIG. 2a. At step 410, the BIOS may arm spare memory locations corresponding to the system memory component address and data to be replaced. Arming the spare memory locations may include, for example, setting an armed bit within a replacement table, such as table 300 discussed above. At step 411, the BIOS may issue a "dummy" memory read to the system memory component address, subsequently triggering an architecture of the memory component to use the spare memory locations corresponding to the faulty memory component locations to process future read and write commands, and to intentionally cause a final correctable error to be detected at the memory controller or processor, which may result in a demand scrub operation, such that the corrected data is written back to the system memory component address.

At step 412, if a system write command is received at the memory component before a read to the armed spare memory locations, the process may progress to step 413, where a write command is received at the architecture of a system memory component and the write data is written into the spare memory locations corresponding to the faulty memory component locations. In contrast, if a system read command (either the BIOS "dummy read" from step 411 or any other system issued read) is received before a system write command, the read command may retrieve data from the system memory component, store into spare memory locations corresponding to the faulty system memory component locations the portions of the data corresponding to the faulty system memory component locations, and then send the read data to the memory controller at step 414. At step 415, the trigger may occur and the spare memory locations may take ownership of the address, using the spare memory locations instead of the faulty memory in the system memory component for all future read and write commands. It should be noted that by the time the BIOS issued "dummy" read and subsequent demand scrub operations occur, the faulty memory has been replaced by the buffer spare memory locations and the data no longer contains any errors.

FIG. 5 illustrates an example method incorporating aspects of the present disclosure. In particular, FIG. 5 describes a method for a controller independent memory replacement of a uncorrectable memory error identified during power-on self test (POST). At step 501, the hardware or firmware memory testing may detect an uncorrectable error in a system memory component. A system memory component may include, for example, DRAM. At step 502, the BIOS may be notified of the error and capture the system memory address. At step 503, the BIOS may translate the system memory address to a system memory component address. The system memory component address may be specific to the architecture of the system memory component instead of a system memory address which reflects the system wide addressing generated by the BIOS/OS. For example, where the system memory is DDR DRAM with DIMMs, the BIOS may translate the memory address to a system memory component address including a specific rank, RAS, CAS, bank, etc. At step 504, the BIOS may determine the failing bits in the memory address range from an error syndrome code.

At step 505, it is determined whether a replacement action is desired. If a replacement action is not desired, the process may progress to step 506, where the process exits without replacing memory. In contrast, if a replacement action is desired, the process may progress to step 507, where it is determined whether spare memory is available. As described above, spare memory location may be within a memory buffer disposed within of coupled to the system memory component, such as a buffer in a load-reduced DIMM or a proprietary Buffer on Board or Buffer on Riser. In certain other embodiments, the spare memory may be within a 3DS/ through-silicon via (TSV) buffer incorporated within a DRAM package. Step 507 may include determining whether a memory buffer exists and whether there are spare memory locations within the buffer for use as replacement locations. If there are not spare memory locations, the process may exit without replacing the memory at step 506. If there are spare memory locations available, the process may proceed to step 508.

At step 508, the BIOS may write the system memory component address and data bits to be replaced into a replacement table within the memory architecture. At step 509, the BIOS may arm the spare memory locations for the system memory component address and data to be replaced. Arming the spare memory locations may include, for example, setting an armed bit in a replacement table within the memory architecture, such as architecture 200 at block 202 from FIG. 2a. Upon the next read or write command to the memory address with faulty locations corresponding to the armed spare memory locations, the architecture may claim the memory address. At step 510, the BIOS may perform a "dummy" memory read to the system memory component address, subsequently triggering an architecture of the memory component to use the spare memory locations corresponding to the faulty memory component locations to process future read and write commands.

At step 511, if a system write commands before a read to the armed replacement address, the process may progress to step 512, where a write command is received at the system memory component and the portion of the write data corresponding to the faulty portions of the write address is written into the spare memory locations. In contrast, if a system read command (either the BIOS "dummy read" from step 510 or any other system issued read) is received before a system write command, the read command may retrieve data from the system memory component, store into spare memory locations corresponding to the faulty system memory component locations the portions of the data corresponding to the faulty system memory component locations, and then send the read data to the memory controller at step 513. At step 514, the trigger may occur and the spare memory locations may own the address, such that the spare memory locations are used for all future read and write commands instead of the fault memory locations in the system memory component. At step 515, the BIOS may initialize the replaced memory with valid memory. At step 516, the BIOS may optionally re-start the hardware or firmware memory testing.

FIG. 6 illustrates an example method incorporating aspects of the present disclosure. In particular, FIG. 6 describes a method for a controller independent memory replacement of a uncorrectable memory error identified during operating system run time. At step 601, an uncorrectable error may occur to a non-critical operating system page, such as an application process, user process, virtual machine, etc. At step 602, the BIOS may be notified of the error. At step 603, the BIOS may capture the uncorrectable system memory address. At step 604, the BIOS may translate the system memory address to a system memory component address. The system memory component address may be specific to the architecture of the system memory component instead of a system memory address which reflects the system wide addressing generated by the BIOS/OS. For example, where the system memory is DDR DRAM with DIMMs, the BIOS may translate the memory address to a system memory component address including a specific rank, RAS, CAS, bank, etc.

At step 605, the BIOS may write the system memory component address and data bits to be replaced a replacement table location in the memory architecture, such as architecture 200 at block 202 in FIG. 2*a*. At step 606, the BIOS may arm the spare memory for the system memory component address and data to be replaced. Arming the spare memory may include, for example, setting an armed bit within a replacement table in the memory architecture. The memory architecture may trigger the spare memory location to claim the memory address on the next read or write command to the memory address.

At step 607, it is determined whether a replacement action is desired and whether spare memory is available. As described above, spare memory locations may be within a memory buffer disposed within the system memory component, such as a buffer in a load-reduced DIMM or a proprietary Buffer on Board or Buffer on Riser. In certain other embodiments, the spare memory location may be within a 3DS/through-silicon via (TSV) buffer incorporated within a DRAM package. Step 607 may include determining whether a memory buffer device coupled to the system memory component exists and whether there are spare memory locations within the memory buffer device. If there are not spare memory locations, the process may exit without replacing the memory at step 608.

At step 609, the BIOS may perform a "dummy" memory read to a system memory component address. At step 610, if a system write command is issued before a read to the armed spare memory locations, the process may progress to step 611, where a write command is received at the system memory component and the write data is written into the spare memory locations corresponding to the faulty system memory component locations. In contrast, if a system read command is received before a system write command, the read command may retrieve data from the system memory component, store into spare memory locations corresponding to the faulty system memory component locations the portions of the data corresponding to the faulty system memory component locations, and then send the read data to the memory controller at step 612. At step 613, the trigger may occur and the spare memory locations may own the address, such that the spare memory locations are used for all future read and write commands instead of the memory in the system memory component.

Consecutively with steps 610-613, the BIOS may inform the operating system that the uncorrectable error address is now functional again at step 614. The OS may then re-initialize the address with valid data/ECC and mark the address/page allocatable. Steps 614 and 615 inform the operating system that the system memory address is functional even though read or write commands to the address will now be processed in the spare memory of the system memory component, such as a buffer. This is beneficial because the operating system can seek to access the system address without accounting for the replacement address, which is automatically handled by the spare memory within the system memory component.

Although the present disclosure has been described in detail, it should be understood that various changes, substitutions, and alterations can be made hereto without departing from the spirit and the scope of the invention as defined by the appended claims.

What is claimed is:

1. A system for controller independent faulty memory replacement, comprising:
   a memory component;
   a memory controller communicably coupled to the memory component, wherein the memory controller directs read and write commands to addresses within the memory component;
   a replacement table accessible by the memory component, wherein the replacement table holds memory component addresses and data bits to be replaced and wherein the replacement table is accessible by the memory component; and
   a spare memory coupled to the memory component, wherein the spare memory is operable to include a replacement memory location corresponding to the memory component addresses within the memory component containing a faulty memory element and to respond to a read or write command from the memory controller directed to the address within the memory component containing the faulty memory element, and wherein the spare memory includes a faulty memory table for storing memory component addresses.

2. The system of claim 1, wherein the spare memory comprises a buffer of the memory component.

3. The system of claim 2, wherein the buffer comprises one of a buffer in a load-reduced dual in-line memory module, a Buffer on Board, or a Buffer on Riser.

4. The system of claim 1, wherein the memory component comprises a double data rate (DDR) dynamic random access memory (DRAM).

5. The system of claim 1, wherein the spare memory comprises a 3DS/through-silicon via (TSV) buffer incorporated within a dynamic random access memory (DRAM) package.

6. The system of claim 1, wherein the spare memory is integrated in the memory component.

7. The system of claim 1, wherein the faulty memory table includes the address within the memory component containing the faulty memory element.

8. The system of claim 7, wherein a basic input/output system (BIOS) populates the faulty memory table.

9. A method for controller independent faulty memory replacement, comprising:
   identifying an error within a memory component;
   writing a memory component address and data bits to be replaced into a replacement table, wherein the replacement table is accessible by the memory component;
   determining if replacement memory is available in spare memory coupled to the memory component;
   writing an address of a memory range containing the error to the spare memory if replacement memory is available;
   setting an armed bit within the replacement table; and
   arming the spare memory to take ownership of the address after the next read or write command from a memory controller is directed to the address.

10. The method of claim 9, wherein a basic input/output system (BIOS) is notified of the error within the memory component and writes the address of the memory range containing the error to the spare memory.

11. The method of claim 9, wherein the memory component comprises a double data rate (DDR) dynamic random access memory (DRAM).

12. The method of claim 11, wherein the spare memory comprises a buffer integrated within the DDR DRAM.

13. The method of claim 9, wherein the error occurs in to a non-critical operating system page.

14. The method of claim 9, further comprising translating the address to a memory component address.

15. The method of claim 9, wherein arming the spare memory comprises setting an armed bit in a faulty memory table stored within the spare memory.

16. The method of claim 9, wherein the error comprise a correctable error.

17. A method for providing controller independent faulty memory replacement, comprising:
 providing a memory component;
 providing a memory controller communicably coupled to the memory component, wherein the memory controller directs read and write commands to addresses within the memory component;
 writing the memory component addresses and data bits to be replaced into a replacement table, wherein the replacement table is accessible by the memory component;
 providing a spare memory coupled to the memory component, wherein the spare memory is operable to include a replacement memory location corresponding to an addresses within the memory component with a faulty memory element and to respond to read and write commands from the memory controller directed to the address within the memory component with the faulty memory element; and
 storing, in a faulty memory table, memory component addresses, wherein the faulty memory table is located within the spare memory.

18. The method of claim 17, wherein the memory component comprises a double data rate (DDR) dynamic random access memory (DRAM).

19. The method of claim 18, wherein the spare memory comprises a buffer integrated within the DDR DRAM.

* * * * *